United States Patent [19]
Kitteridge

[11] Patent Number: 6,093,522
[45] Date of Patent: *Jul. 25, 2000

[54] PROCESSING OF LITHOGRAPHIC PRINTING PLATE PRECURSORS

[75] Inventor: John Michael Kitteridge, Leeds, United Kingdom

[73] Assignee: Agfa-Gevaert, N.V., Mortsel, Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 09/182,663

[22] Filed: Oct. 30, 1998

[30] Foreign Application Priority Data

Nov. 1, 1997 [GB] United Kingdom ............ 9723026

[51] Int. Cl.$^7$ ........................................ G03C 5/26
[52] U.S. Cl. .................. 430/432; 134/15; 134/34
[58] Field of Search ................ 430/432; 134/15, 134/34

[56] References Cited

U.S. PATENT DOCUMENTS

| | | | |
|---|---|---|---|
| 5,196,290 | 3/1993 | Coppens et al. | 430/204 |
| 5,518,866 | 5/1996 | Coppens et al. | 430/331 |
| 5,763,149 | 6/1998 | Deprez | 430/331 |

*Primary Examiner*—Hoa Van Le
*Attorney, Agent, or Firm*—Breiner & Breiner

[57] ABSTRACT

A wash liquor for use in the decoating of a silver halide diffusion transfer printing plate comprises an aqueous solution containing at least one organic or inorganic acid salt, such as the silicate, metasilicate, tartrate, citrate, hydroxycarboxylate, borate, hexametaphosphate, tripolyphosphate or pyrophosphate of sodium or potassium. The liquor preferably also contains at least one of a non-ionic surfactant, an enzyme and a biocide. A process for the decoating of the said printing plate is also disclosed.

17 Claims, No Drawings

PROCESSING OF LITHOGRAPHIC PRINTING PLATE PRECURSORS

DESCRIPTION

This invention relates to the processing of lithographic printing plate precursors and is principally concerned with the wash water used in the production of a lithographic printing plate by means of the system known as silver diffusion transfer.

The well-known comparatively high sensitivity to light of silver halides over conventional photopolymeric materials and their ability to respond to light from ultra-violet and infra-red make them ideally suited for use in printing plate applications where direct-to-plate exposure, rather than exposure through a contact film intermediate, is required.

Silver halides in this context can be used in a variety of ways. Printing plates, in general, include at least one layer of photosensitive material; such a layer may comprise a silver halide in combination with gelatin or other matrix binder, so providing a tough, ink-receptive image. This technique is often referred to as tanning development. Alternatively, a silver halide emulsion layer can be overcoated onto a conventional photopolymerisable layer of a printing plate. The consequence of the difference in sensitivity between the layers is that, at a given intensity of radiation, a short light exposure can be used to imagewise expose the top silver halide layer which, on development, forms a mask for a longer, blanket light exposure to convert the polymeric layer into a soluble or insoluble form depending on the nature of the photopolymer.

A third general use of silver halide in printing plate applications is the well known technique of diffusion transfer reversal (DTR). The principles of the DTR process have been described in U.S. Pat. No. 2,352,014 and in "Photographic Silver Halide Diffusion Processes" by Andre Rott and Edith Weyde, The Focal Press, London and New York, 1972. In this method, a developer is used which chemically develops exposed areas of the photosensitive coating whilst at the same time dissolving the unexposed areas. The developer contains a so-called silver halide solvent, such as sodium thiosulphate or sodium thiocyanate, and the complexes formed by these solvents with the dissolved silver halide from the unexposed areas diffuse to an image-receiving element, typically a nucleation layer containing physical development nuclei, and are reduced therein with a developing agent to form a silver image (DTR image) having reversed image density values with respect to the black silver image obtained in the exposed areas of the photographic material. An assembly including a DTR image may be used as a planographic printing plate, the silver image areas being the water-repellent, ink-receptive areas on an otherwise water-receptive, ink repellent background. The oleophilicity of the silver image areas may be improved by treatment with a suitable oleophilising agent, such as a mercapto compound.

Two different diffusion transfer systems are known. The two sheet system includes a silver halide layer and a receiving layer which are on separate substrates, and the system relies on the diffusion of silver halide from the former layer to the latter when the two are placed in contact in the presence of a developer. In the single sheet system, however, the silver halide layer and the receiving layer are both coated on the same substrate, and a water permeable relationship exists between the layers, allowing for image formation on application of a developer, following exposure. It is the latter, single sheet, system which is preferred for the preparation of offset lithographic printing plates via the diffusion transfer method.

There are two different types of single sheet diffusion transfer printing plates currently provided by the known art. In the first instance, plates are disclosed in, for example, U.S. Pat. No. 4,722,535 and GB-A-1241661, wherein a support is coated, in order, with a silver halide emulsion layer and an image receiving layer containing physical development nuclei. Following imagewise exposure and development, the plate is used for printing without removal of the spent emulsion layer. A second type of plate, however, includes the coatings applied in a different order, such that a support is coated first with a layer of physical development nuclei, then subsequently with a silver halide emulsion layer. The assembly is imagewise exposed and developed, then washed with water or an aqueous wash-off solution to remove the spent emulsion layer, thereby leaving a support carrying a silver image which may be used as a printing plate. Plates of this type are disclosed, for example, in EP-B-278766 and EP-A-410500.

Generally, water has been most commonly used as the wash-off solution for removal, or decoating, of the spent emulsion layer. However, it is reported in EP-A-519123 that improved print endurance is achieved when the water is buffered to a pH between 4 and 8, whereas EP-A-610982 discloses a preferred pH in the range from 10.5 to 13 as a means of eliminating unpleasant odours associated with the liquor.

It is clearly desirable to provide a wash-off solution which fulfils both of the above objectives. Furthermore, ecological, economic and general practical considerations also dictate that re-use of this liquor to the maximum extent possible would be particularly advantageous; however, there are serious limitations in this respect, since the efficiency of decoating is affected by changes in the composition of the liquor which are associated with factors such as carry over of developer and build up of coating products.

It is the object of the present invention to provide a wash liquor which facilitates the achievement of the above objectives, thereby providing a decoating process having enhanced efficiency and consistency.

During exposure of a two sheet diffusion transfer plate, all the silver halide in the exposed areas is converted to silver, which is dispersed throughout a binder material, this generally comprising gelatin. Subsequently, this spent composition is removed by means of the wash liquor which, for the economic and ecological reasons already noted, is subsequently recirculated, the silver preferably being removed by means of a filtration system, such as that described in EP-A-651063. The recirculated liquor will, however, contain increasing amounts of coating and used developer after it has been recirculated and, as this process continues, it is found that the ability of the wash water to decoat the plate is actually enhanced; whilst this effect may appear to offer benefits, it can also give rise to inconsistencies in the decoating process. Consequently, on occasions, the cleanliness in background areas may be unsatisfactory, causing poor quality prints to be obtained on the press. It has now been found however, that significant improvements in the cleanliness of background areas, and the consistency thereof, can be achieved by the incorporation of salts in the wash water.

According to the present invention, there is provided a wash liquor for use in the decoating of a silver halide diffusion transfer printing plate, said wash liquor comprising an aqueous solution containing at least one organic or inorganic acid salt.

Particularly successful results are obtained when said salt comprises a silicate, metasilicate, tartrate, citrate, hydroxycarboxylate, borate, hexametaphosphate, tripolyphosphate or pyrophosphate, and said solution is prepared using fresh water. Most preferably, the salt comprises a tripolyphosphate or pyrophosphate and is present as an alkali metal salt, in particular, the sodium or potassium salt.

Various concentrations of the salt may be employed, preferably ranging from 0.1 to 20 g/l, although the optimum range is between 0.5 to 5.0 g/l. Similarly, the pH may be varied within the relatively wide preferred limits of 8 to 13, although the more preferred range is from 9 to 12. The temperature is generally controlled to be between 20° C. and 50° C., although the best results are achieved between 30° C. and 45° C.

In addition to these salts, the wash liquor may also contain further additives including, for example, an enzyme, a biocide or the like. Preferably, the liquor will contain at least one non-ionic surfactant, such as a low foam modified alcohol ethoxylate, as disclosed in our co-pending Application No. GB 9723025.4, to provide cleaner plate processing. Most preferably, the wash water additionally includes an enzyme which is capable of degrading gelatin, for example trypsin, pepsin, papain or a bacterial proteinase such as Alcalase® 2.5L (supplied by Novo Enzymes Limited).

The decoating process is most successfully carried out by treating the plate with the wash liquor whilst, at the same time, applying mechanical forces. Thus, the use of high pressure jets or scrubbing rollers produces the most satisfactory results.

The printing plate used in conjunction with the wash liquor of the present invention is, most preferably, a single sheet diffusion transfer printing plate comprising a substrate, an image receiving layer and a silver halide emulsion layer.

The substrate used is generally aluminium, which may be pure aluminium or, alternatively, may comprise an aluminium alloy having an aluminium content of at least 95%. The thickness of the substrate preferably lies in the range between 0.13 mm and 0.5 mm. In order to enhance its lithographic properties, the aluminium is electrochemically grained and anodised on at least one surface. Graining of the substrate may be achieved by treating the surface with an aqueous acid or a mixture of acids; typically, hydrochloric acid, or a mixture of hydrochloric and nitric acids may be employed. Anodising is preferably carried out by treating the grained aluminium substrate in an aqueous mineral acid or a mixture of such acids. Most satisfactory results are obtained by the use of sulphuric or phosphoric acids or their mixtures. Typical graining and anodising conditions are disclosed in U.S. Pat. No. 3,861,917. Most preferably, the graining and anodising conditions are selected such that the substrate has an anodic weight ($g/m^2$) to surface roughness (microns) ratio greater than 6, more particularly greater than 8, according to the disclosures of EP-B-278766.

Optionally, the grained and anodised aluminium may be laminated to other materials, such as paper or various plastics materials, in order to enhance its flexibility whilst retaining the good dimensional stability associated with aluminium.

The image receiving layer preferably comprises a metal sol, most preferably colloidal silver nuclei prepared by the Carey Lea method at a coating weight in the region of 3 $mg/m^2$. The colloidal nuclei are optionally dispersed in a suitable binder, most preferably gelatin. Alternative colloidal nuclei which may be employed include sulphides of heavy metals, such as silver sulphide or palladium sulphide.

The silver halide emulsion layer may be any photosensitive silver halide emulsion incorporating a hydrophilic colloid binder. The photosensitive silver halide may comprise, for example, silver chloride, silver bromide, silver bromoiodide or silver chlorobromide or their mixtures. The use of an emulsion containing in excess of 50% silver chloride is preferred in order that a sufficiently high rate of dissolution of the silver halide may be achieved during development, and that satisfactory gradation may be obtained for lithographic purposes. It is also desirable that the emulsion should include a minimum of 20% silver bromide, thereby ensuring adequate stability on the grained, anodised aluminium substrate.

The silver halide emulsion may include coarse or fine grains, and can be prepared by any of the standard procedures well known to those skilled in the art. Optionally, the emulsion may be chemically and spectrally sensitised. The available techniques for the preparation and coating of the emulsion are detailed in Product Licensing Index, Volume 92, December 1971, publication 9232.

In addition to the preferred negative working silver halide emulsions, which exhibit particularly high photosensitivity, direct positive silver halide emulsions, producing a positive silver image in the emulsion layer and a negative silver image on the aluminium substrate, may also be employed.

The emulsion layer also includes a hydrophilic colloid binder, as previously disclosed. Generally, the binder comprises a protein, preferably gelatin. However, partial replacement of the gelatin with suitable synthetic, semi-synthetic or natural polymers is possible.

Optionally, the emulsion may also include further components such as antifogging agents, development agents, development accelerators, wetting agents, stabilisers, acutance dyes and pigments, matting agents and the like.

Additionally, it is possible to include a further, intermediate, water-swellable layer between the image receiving layer and the silver halide emulsion layer. Suitable intermediate layer formulations are detailed in EP-A-483415.

The diffusion transfer plate containing the above elements is imagewise exposed to a beam of energy, and the exposed plate is developed by treatment with an aqueous alkaline solution in the presence of at least one developing agent and at least one silver halide solvent. The developing agent or agents and the silver halide solvent or solvents may be incorporated in the aqueous solution and/or in the actual imaging element itself.

The most suitable developing agents for use in conjunction with the present invention are hydroquinone-type compounds in combination with secondary developing agents. Preferably, the hydroquinone-type compound is hydroquinone itself, methyl hydroquinone or chlorohydroquinone.

The secondary developing agent comprises p-N-methylaminophenol, 1-phenyl-3-pyrazolidone, or a derivative of the latter, such as 4-methyl-1-phenyl-3-pyrazolidone, 4,4-dimethyl-1-phenyl-3-pyrazolidone, 4-hydroxymethyl-4-methyl-1-phenyl-3-pyrazolidone or 4-methyl-1-tolyl-3-pyrazolidone.

Typical silver halide solvents for use in relation to the present invention include thiosulphates and thiocyanates which are able to form complexes with silver halides, for example ammonium thiosulphate, potassium thiosulphate or, most preferably, sodium thiosulphate pentahydrate, which is used at a level of 5 to 150 g/l, preferably 10 to 80 g/l. Alternative silver halide solvents are disclosed in the prior art; for example polythioethers are described in U.S.

Pat. No. 5,200,294, EP-A-554585 mentions the use of meso-ionic compounds, whilst cyclic imides and thiosalicylates are the subjects of U.S. Pat. No. 4,297,430 and U.S. Pat. No. 2,857,276, respectively.

Optionally, combinations of silver halide solvents may be employed, and it is possible to incorporate one or more silver halide solvents into a suitable layer of the plate, and also include one or more silver halide solvents in the developing solution.

The aqueous alkaline developing solution typically incorporates common alkaline materials such as sodium hydroxide, potassium hydroxide, sodium carbonate or alkali metal salts of phosphoric and/or silicic acid, eg trisodium phosphate and sodium metasilicate. The solution may also include other ingredients, examples being oxidation preservatives, eg sodium sulphite, bromide salts, calcium sequestering agents, anti-sludge agents, antifoggants and thickening agents.

Preferably, the alkaline developing solution also contains amines or alkanolamines which act as development accelerators and, in addition, function as silver halide solvents; typical examples include 2-amino-2-methyl-1-propanol, 2-amino-2-methyl-1,3-propanediol, 2-amino-2-ethyl-1,3-propanediol, tris(hydroxymethyl) aminomethane, 2-amino-2-ethyl-1-propanol, 1-amino-2-propanol, 2-methylaminoethanol, ethanolamine, diethanolamine, triethanolamine and N,N-diethylaminoethanol.

The development and diffusion transfer operations may be carried out by means of any of a number of standard techniques, for example, by dipping the material to be treated in to the liquid composition. Said treatment is generally carried out at a temperature in the range of 15–30° C. and over a period of around 5–60 seconds. Any excess of alkaline developer remaining following the development process and formation of the silver image may be removed by passing the plate through a pairs of squeezing rollers.

The surface of the silver image thereby produced in the layer of physical development nuclei may then be exposed by washing the plate with water, such that removal of all the layers above this layer takes place.

Improved printing performance may be achieved by chemical treatment of the imaged surface of the aluminium with a formulation which increases the hydrophilicity of the background areas and also enhances the oleophilicity of the silver image. Said formulation for after treatment of plates is generally referred to as a fixer or finisher and, in the present case, would typically comprise an enzyme and a hydrophobising (oleophilising) compound. Typical such compositions are disclosed in EP-B-131462.

After said finishing treatment, the plate is ready for use in printing operations and may be used on a printing press to produce high quality prints.

The invention now be illustrated, without limitation, by reference to the following experiments:

EXPERIMENT 1

A silver chlorobromide emulsion in a gelatin binder having a silver to gelatin weight ratio of 1:1 was coated at a coat weight of 4.0 g/m² onto grained and anodised aluminium substrate which had been previously coated with a Carey Lea silver sol at a coat weight of 3 mg/m². The system thus constitutes an integral DTR assembly. The plate was exposed on a sensitometer through a 0.05 density step wedge, and then developed at 20° C. for 20 seconds in the following developer solution:

| | |
|---|---|
| Sodium sulphite | 100 g |
| Hydroquinone | 20 g |
| 1-phenyl-3-pyrazolidone | 6.0 g |
| Sodium hydroxide | 17 g |
| Sodium bromide | 3.0 g |
| Sodium thiosulphate.5H$_2$O | 20 g |
| Na$_4$EDTA | 2.0 g |
| 2-Methylaminoethanol | 30 ml |
| Water to 1 liter | |

The developed plate was decoated in water containing various additives, at 40° C., washed with water and then dried. The reflected optical density of the steps on the step wedge on the plate was measured with a Vipens densitometer. The densitometer was zeroed on a fully exposed and processed piece of plate. The highest step number with a density of zero was recorded. The higher the step number the more efficient was the decoating of the plate. Wash water pH and silver image adhesion were also noted.

| | Additive | Wash water pH | Step number | Silver image adhesion |
|---|---|---|---|---|
| 1 | None | — | 14.5 | good |
| 2 | 10 g/l Na$_4$EDTA | 11.3 | 20 | poor |
| 3 | 10 g/l Na$_2$CO$_3$ | 11.2 | 18.5 | fair |
| 4 | 10 g/l NaCl | — | 14 | good |
| 5 | 5 g/l Na$_2$SiF$_6$ | — | 16.5 | good |
| 6 | 10 g/l Na$_2$EDTA | 4.5 | 12.5 | good |
| 7 | 10 g/l Na$_2$SO$_4$ | — | 14 | good |
| 8 | 5 g/l Na$_2$HPO$_4$.12H$_2$O | 8.7 | 18.5 | good |
| 9 | 5 g/l Na$_3$PO$_4$.12H$_2$O | 11.8 | 20.5 | poor |
| 10 | 5 g/l Na acetate 3H$_2$O | 7.9 | 18 | good |
| 11 | 5 g/l Na$_2$B$_4$O$_7$.10H$_2$O | 9.2 | 20 | good |
| 12 | 10 g/l Na hexametaphosphate | 6.5 | 19.5 | good |
| 13 | 5 g/l KNa tartrate.4H$_2$O | 7.7 | 20 | good |
| 14 | 1 g/l Na tripolyphosphate | 9.6 | 19.5 | good |
| 14 | 10 g/l Na tripolyphosphate | 9.8 | 21 | good |
| 16 | 1 g/l Na metasilicate | 11.7 | 20 | good |
| 17 | 5 g/l Na metasilicate | 12.2 | 20 | good |
| 18 | 1 g/l K pyrophosphate | 10.0 | 21 | good |
| 19 | 5 g/l K pyrophosphate | 10.2 | 21 | good |
| 20 | 5 g/l Na$_3$citrate | 8.4 | 20 | good |
| 21 | 5 g/l K$_3$citrate.H$_2$O | 8.5 | 21 | good |
| 22 | 1 g/l Na metasilicate + 1 g/l Na tripolyphosphate | — | 21 | good |

EXPERIMENT 2

A silver chlorobromide emulsion in a gelatin binder having a silver to gelatin weight ratio of 1:1 was coated at a coat weight of 4.0 g/m² onto grained and anodised aluminium substrate which had been previously coated with a Carey Lea silver sol. The plate was exposed for 12 units at f22 to a target on a Silverlith® M10 camera, processed in an Autolith SLT70 automatic processor comprising a development section, a wash section and a finisher section.

Development was for 20 seconds at 21° C. in the developer

| | |
|---|---|
| Sodium carboxymethylcellulose | 10 g |
| Sodium sulphite | 100 g |
| Hydroquinone | 20 g |
| 1-Phenyl-3-pyrazolidone | 5.0 g |
| Sodium hydroxide | 17 g |

-continued

| | |
|---|---|
| Sodium thiosulphate.5H$_2$O | 20 g |
| Na$_4$EDTA | 2.0 g |
| 2-Methylaminoethanol | 30 ml |
| Water to 1 liter | |

The wash section contained a scrubbing roller and 25 liters of fresh water at 32° C.

The finisher applied by an applicator roller, comprised

| | |
|---|---|
| Sodium carboxymethycellulose | 5 g |
| Calcium nitrate | 0.1 g |
| Trypsin (Novo Porcine 2500K) | 0.3 g |
| Bacteron B6 (Bactria Biocides) | 3.0 ml |
| Sodium dihydrogen phosphate | 10 g |
| Disodium hydrogen phosphate | 10 g |
| Phenyl mercaptotetrazole | 2.0 g |
| Water to 1 liter | |

The reflected optical density of a selected 'white' background area on the processed plate was measured with a Vipens densitometer.

15 m$^2$ of 80% exposed scrap plate were then processed, followed by another camera exposed plate.

| Area processed, m$^2$ | Density on plate |
|---|---|
| 0 | 0.03 |
| 15 | 0.00 |

The above procedure was then repeated using fresh water containing 2 g/l K pyrophosphate.

| Area processed, m$^2$ | Density on plate |
|---|---|
| 0 | 0.00 |
| 15 | 0.00 |

I claim:

1. A process for the decoating of a silver halide diffusion transfer printing plate, said process including the step of treating the plate with a wash liquor comprising an aqueous solution containing at least one organic or inorganic acid salt and having a pH value in a range of from 8.4 to 13.

2. A process as defined in claim 1 wherein said treatment is carried out at a temperature of from 20° to 50° C.

3. A process as defined in claim 2 wherein said temperature is from 30° to 45° C.

4. A process as defined in claim 1 wherein said treatment is carried out whilst simultaneously applying a mechanical force to said printing plate.

5. A process as defined in claim 4 wherein said mechanical force is applied by means of high pressure jets or scrubbing rollers.

6. A process as defined in claim 1 wherein said organic acid salt is a tartrate, citrate or hydroxycarboxylate.

7. A process as defined in claim 1 wherein said inorganic acid salt is a silicate, metasilicate, borate, hexametaphosphate, tripolyphosphate or pyrophosphate.

8. A process as defined in claim 7 wherein said tripolyphosphate or pyrophosphate salt is present as an alkali metal salt.

9. A process as defined in claim 8 wherein said alkali metal salt comprises a sodium or potassium salt.

10. A process as defined in claim 1 wherein said salt is present in an amount of from 0.1 to 20 g/l.

11. A process as defined in claim 10 wherein said salt is present in an amount of from 0.5 to 5.0 g/l.

12. A process as defined in claim 1 wherein said pH value is in the range of from 9 to 12.

13. A process as defined in claim 1 wherein said wash liquor further comprises at least one non-ionic surfactant.

14. A process as defined in claim 13 wherein said non-ionic surfactant comprises a low foam modified alcohol ethoxylate.

15. A process as defined in claim 1 wherein said wash liquor further comprises at least one member selected from the group of an enzyme and a biocide.

16. A process as defined in claim 15 wherein said member is an enzyme that is capable of degrading gelatin.

17. A process as defined in claim 16 wherein said enzyme comprises trypsin, pepsin, papain or a bacterial protease.

* * * * *